United States Patent
Sunachi et al.

(10) Patent No.: US 12,467,160 B2
(45) Date of Patent: Nov. 11, 2025

(54) GaAs WAFER AND METHOD OF PRODUCING GaAs INGOT

(71) Applicant: DOWA Electronics Materials Co., Ltd., Tokyo (JP)

(72) Inventors: Naoya Sunachi, Akita (JP); Ryuichi Toba, Sendai (JP); Akira Akaishi, Akita (JP)

(73) Assignee: DOWA Electronics Materials Co., Ltd., Tokyo (JP)

(*) Notice: Subject to any disclaimer, the term of this patent is extended or adjusted under 35 U.S.C. 154(b) by 301 days.

(21) Appl. No.: 18/247,644

(22) PCT Filed: Sep. 27, 2021

(86) PCT No.: PCT/JP2021/035464
§ 371 (c)(1),
(2) Date: Apr. 3, 2023

(87) PCT Pub. No.: WO2022/075112
PCT Pub. Date: Apr. 14, 2022

(65) Prior Publication Data
US 2023/0392291 A1   Dec. 7, 2023

(30) Foreign Application Priority Data
Oct. 5, 2020   (JP) .................. 2020-168750

(51) Int. Cl.
*C30B 29/42* (2006.01)
*H01L 21/02* (2006.01)
*H10D 62/854* (2025.01)

(52) U.S. Cl.
CPC ........ *C30B 29/42* (2013.01); *H01L 21/02002* (2013.01); *H10D 62/854* (2025.01)

(58) Field of Classification Search
CPC ... C30B 29/42; C30B 11/00; H01L 21/02002; H01D 62/854
See application file for complete search history.

(56) References Cited

U.S. PATENT DOCUMENTS

| | | | |
|---|---|---|---|
| 5,209,811 A * | 5/1993 | Kitagawara | C30B 29/42 117/3 |
| 2004/0187768 A1 | 9/2004 | Kenya et al. | |
| 2007/0012238 A1* | 1/2007 | Kretzer | C30B 29/40 117/19 |

FOREIGN PATENT DOCUMENTS

| | | |
|---|---|---|
| EP | 4166698 A1 | 4/2023 |
| JP | 2011527280 A | 10/2011 |

(Continued)

OTHER PUBLICATIONS

Apr. 19, 2022, Notification of Reasons for Refusal issued by the Japan Patent Office in the corresponding Japanese Patent Application No. 2020-168750.

(Continued)

*Primary Examiner* — Robert M Kunemund
(74) *Attorney, Agent, or Firm* — KENJA IP LAW PC

(57) ABSTRACT

Provided is a GaAs wafer that can suitably be used to produce LiDAR sensors in particular and a method of producing a GaAs ingot that can be used to obtain such a GaAs wafer. The GaAs wafer has a silicon concentration of $5.0 \times 10^{17}$ cm$^{-3}$ or more and less than $3.5 \times 10^{18}$ cm$^{-3}$, an indium concentration of $3.0 \times 10^{17}$ cm$^{-3}$ or more and less than $3.0 \times 10^{19}$ cm$^{-3}$, and a boron concentration of $1.0 \times 10^{18}$ cm$^{-3}$ or more. The average dislocation density of the GaAs wafer is 1500/cm$^2$ or less.

10 Claims, 5 Drawing Sheets

(56) References Cited

FOREIGN PATENT DOCUMENTS

| JP | 2013126943 A | 6/2013 |
|----|--------------|--------|
| JP | 2015078122 A | 4/2015 |

OTHER PUBLICATIONS

Jul. 8, 2022, Office Action issued by the Taiwan Intellectual Property Office in the corresponding Taiwanese Patent Application No. 110137053.
Nov. 30, 2021, International Search Report issued in the International Patent Application No. PCT/JP2021/035464.
Nov. 30, 2021, Notification of Reasons for Refusal issued by the Japan Patent Office in the corresponding Japanese Patent Application No. 2020-168750.
Yasuo Seki et al., Impurity effect on grown-in dislocation density of InP and GaAs crystals, Journal of Applied Physics, Feb. 1978, pp. 822-828, vol. 49, No. 2.
Mar. 28, 2023, International Preliminary Report on Patentability issued in the International Patent Application No. PCT/JP2021/035464.
Oct. 8, 2024, the Extended European Search Report issued by the European Patent Office in the corresponding European Patent Application No. 21877413.1.

* cited by examiner

GaAs WAFER AND METHOD OF PRODUCING GaAs INGOT

TECHNICAL FIELD

This disclosure relates to a GaAs wafer and a method of producing a GaAs ingot.

BACKGROUND

Known methods of producing a GaAs crystal (ingot) for obtaining a GaAs single crystal wafer (hereinafter also referred to as a GaAs wafer) include a pulling (LEC) method, the horizontal boat (HB) method, the vertical gradient freeze (VGF) method, and the vertical Bridgman (VB) method. A block of a single crystal that is obtained by crystal growth from a seed crystal of a single crystal using these production methods and has a straight body part is an ingot. Wafers are cut from the straight body part of the ingot.

Of the above methods, with the LEC method, the dislocation density of a GaAs wafer is hardly reduced. Techniques of obtaining low dislocation density by the LEC method using indium (In) doping has been temporarily trendy; however, since the doping is performed with a large amount of In so that the doped wafer is even called an alloy of GaAs and In, a large amount of In is precipitated, and resulting wafers were found to be unusable as products, thus LEC methods using In doping are not used at present.

While the etch pit density of commercial products obtained using LEC methods is on the order of 10000 cm$^{-1}$, with the vertical gradient freeze (VGF) method and the vertical Bridgman (VB), substantially lower dislocation density can be obtained compared with LEC methods. JP 2015-078122 A (PTL 1) discloses an n-type GaAs ingot made using the VGF method or the VB method. This n-type GaAs ingot has a charge carrier concentration of $1\times10^{16}$ cm$^{-3}$ or more and $1\times10^{18}$ cm$^{-3}$ or less and a boron concentration of $5\times10^{17}$ cm$^{-3}$ or more, has an etch pit density of a cross section perpendicular to the crystallographic axis of the ingot is 1500/cm$^2$ or less; and is intended to achieve a significantly low light absorption coefficient in the near-infrared range. Note that the n-type GaAs ingot in PTL 1 is obtained by controlling the gallium concentration and the boron concentration of a gallium arsenide melt during production, and should avoid being further doped with other dopants such as Zn and In.

CITATION LIST

Patent Literature

PTL 1: JP 2015-078122 A

SUMMARY

Technical Problem

In recent years, sensors using a method called light detection and ranging (LiDAR) particularly attract attention for autonomous driving applications for automobiles. LiDAR uses infrared radiation with wavelengths including 940 nm. In a light emitting device emitting infrared radiation, a GaAs wafer is used as a device substrate, and for LiDAR applications, the absorption of the above wavelengths by the GaAs wafer has become required to be inhibited.

In the case of a Si-doped n-type GaAs wafer, as the Si doping level increases and free carriers increase, the absorption of infrared radiation increases. Accordingly, for a Si-doped GaAs wafer made using the VGF method or the VB method, to sufficiently reduce absorption of the above wavelengths, the carrier concentration of the GaAs wafer is necessarily limited to approximately $1\times10^{18}$ cm$^{-3}$ or less (preferably $5\times10^{17}$ cm$^{-3}$ or less). Further, GaAs wafers used to produce LiDAR sensors are also required to have a sufficiently low dislocation density. However, since the dislocation density is significantly increased when the Si doping level is reduced to reduce the carrier concentration, it has been difficult to achieve low dislocation density while achieving the above carrier concentration and sufficiently inhibiting absorption of light of the above wavelengths. For GaAs wafers having a large diameter, of which dislocation density is hardly reduced, the three conditions of the carrier concentration, inhibited absorption of light, and low dislocation density have been significantly hardly achieved.

It could therefore be helpful to provide a GaAs wafer of which carrier concentration and light absorption coefficient at a wavelength of 940 nm is controlled, and average dislocation density is reduced. It could also be helpful to provide a method of producing a GaAs ingot that makes it possible to obtain such a GaAs wafer.

Solution to Problem

The present inventors have diligently studied to achieve the above challenges, and focusing attention on the silicon concentration, the indium concentration, and the boron concentration of a GaAs wafer has led to this disclosure.

This disclosure primarily includes the following features.

(1) A GaAs wafer comprising:
silicon with a silicon concentration of $5.0\times10^{17}$ cm$^{-3}$ or more and less than $3.5\times10^{18}$ cm$^{-3}$;
indium with an indium concentration of $3.0\times10^{17}$ cm$^{-3}$ or more and less than $3.0\times10^{19}$ cm$^{-3}$; and
boron with a boron concentration of $1.0\times10^{18}$ cm$^{-3}$ or more,
wherein an average dislocation density of the GaAs wafer is 1500/cm$^2$ or less.

(2) The GaAs wafer according to (1) above,
wherein a carrier concentration is $6.0\times10^{17}$ cm$^{-3}$ or more.

(3) The GaAs wafer according to (1) or (2) above,
wherein the indium concentration is $1.0\times10^{18}$ cm$^{-3}$ or more and $1.2\times10^{19}$ cm$^{-3}$ or less, and
the average dislocation density is 500/cm$^2$ or less.

(4) The GaAs wafer according to any one of (1) to (3) above,
wherein a carrier concentration is in a range of $8.0\times10^{17}$ cm$^{-3}$ or more and $1.4\times10^{18}$ cm$^{-3}$ or less, and an absorption coefficient at a wavelength of 940 nm is 4.8 cm$^{-1}$ or more and 7.2 cm$^{-1}$ or less.

(5) The GaAs wafer according to any one of (1) to (3) above,
wherein a carrier concentration is $7.0\times10^{17}$ cm$^{-3}$ or more and $8.0\times10^{17}$ cm$^{-3}$ or less, and an absorption coefficient at a wavelength of 940 nm is 4.8 cm$^{-1}$ or more and 6.8 cm$^{-1}$ or less.

(6) A method of producing a GaAs ingot, the method comprising performing a vertical gradient freeze method or a vertical Bridgman method using silicon as a dopant and using boron oxide as a sealant,
wherein indium is used together with the silicon as the dopant, an amount of silicon charged is 70 wt ppm or more and 130 wt ppm or less with respect to a GaAs feedstock, and an amount of indium charged is 100 wt ppm or more and 5000 wt ppm or less with respect to the GaAs feedstock, and an average dislocation density of the GaAs ingot is 1500/cm$^2$ or less.

(7) The method of producing a GaAs ingot, according to (6) above, wherein the GaAs ingot includes a part having a carrier concentration of $6.0 \times 10^{17}$ cm$^{-3}$ or more.

(8) The method of producing a GaAs ingot, according to (6) or (7) above, wherein the average dislocation density is 500/cm$^2$ or less.

(9) The method of producing a GaAs ingot, according to any one of (6) to (8) above, wherein the GaAs ingot includes a part having a carrier concentration of $8.0 \times 10^{17}$ cm$^{-3}$ or more and $1.4 \times 10^{18}$ cm$^{-3}$ or less, and an absorption coefficient of 4.8 cm$^{-1}$ or more and 7.2 cm$^{-1}$ or less at a wavelength of 940 nm.

(10) The method of producing a GaAs ingot, according to any one of (6) to (8) above, wherein the GaAs ingot has a part having a carrier concentration of $7.0 \times 10^{17}$ cm$^{-3}$ or more and $8.0 \times 10^{17}$ cm$^{-3}$ or less, and an absorption coefficient of 4.8 cm$^{-1}$ or more and 6.8 cm$^{-1}$ or less at a wavelength of 940 nm.

Advantageous Effect

This disclosure can provide a GaAs wafer that can be suitably used to produce LiDAR sensors by controlling the silicon concentration, the indium concentration, and the boron concentration of a GaAs wafer. Further, this disclosure can provide a method of producing a GaAs ingot that can be used to obtain such a GaAs wafer.

DETAILED DESCRIPTION

A GaAs wafer according to this disclosure can be obtained by slicing a GaAs ingot obtainable by a method of producing a GaAs ingot, according to this disclosure. Prior to describing the embodiments of this disclosure, components and physical property measurements for describing the features of this disclosure will be described.

<GaAs Ingot>
(Seed Side End, Center Portion, and Tail Side End of GaAs Ingot)

Figure 1:
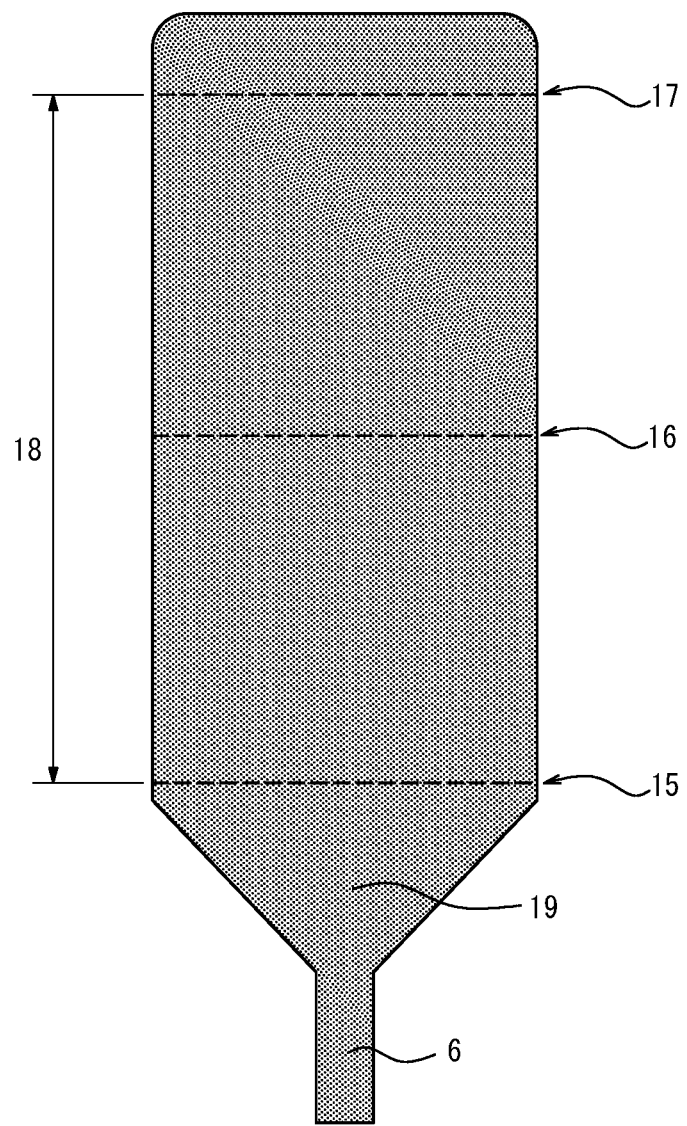
FIG. 1 is a schematic view of a GaAs ingot of this disclosure.

FIG. 1 is a schematic view of a GaAs ingot obtainable according to the production method of this disclosure, and illustrates the positions of a seed side end 15, a center portion 16, and a tail side end 17. The GaAs ingot has a region 19 (also referred to as a cone part) having a diameter increasing from a seed crystal 6, and the GaAs ingot has a straight body part 18 having almost the same diameter on the top of the region 19; the end of the straight body part 18 on the seed crystal 6 side is referred to as the seed side end 15; the end of the straight body part 18 on the side opposite to the seed crystal 6 is referred to as the tail side end 17; and the middle position (center position) between the seed side end 15 and the tail side end 17 is referred to as a center portion 16. Crystal growth of the GaAs ingot is performed such that the solid-liquid interface shifts from the seed side end 15 to the tail side end 17.

Measures of the silicon (Si) concentration, the indium (In) concentration, the boron (B) concentration, the carrier concentration, the average dislocation density, and the absorption coefficient at a wavelength of 940 nm of a GaAs wafer according to this disclosure can be obtained by performing measurements on wafers obtained by slicing the straight body part 18 of the GaAs ingot, and evaluation was performed on at least one area of the seed side end 15, the center portion 16, and the tail side end 17 in the straight body part 18 of the GaAs ingot. The wafers can have a proper size by selecting the diameter of the straight body part 18 of the GaAs ingot; for example, the size may be 2 in to 8 in.

On the other hand, when a GaAs ingot is evaluated, the measures mentioned above are obtained for at least wafers of one of the three areas: wafers of the seed side end 15 of the straight body part 18 of the GaAs ingot, wafers of the center portion 16, and wafers of the tail side end 17 of the straight body part 18; and the measures for two or more of the areas are preferably obtained. Note that the wafers of the seed side end 15 of the straight body part 18 in the GaAs ingot refer to the first to fifth wafers from the seed side end, sliced from the straight body part 18 in the GaAs ingot; wafers of the center portion 16 of the straight body part 18 in the GaAs ingot refer to one of the wafers sliced from the straight body part 18 in the GaAs ingot, which corresponds to the center portion 16 (when the center portion 16 is the plane of slicing, either one of the two wafers sharing the plane of slicing) and two pairs of wafers bookending it; and wafers of the tail side end 17 of the straight body part 18 refer to the last to the fifth last wafers obtained most on the tail side, the last wafer being counted from the first wafer obtained most on the seed side. For the wafers for the seed side end, the center portion, and the tail side end, the wafers of each area can be regarded as having the same measures; and when the measures are different, the differences are within the margin of error.

In the measurements on the wafers of the seed side end 15, the wafers of the center portion 16, and the wafers of the tail side end 17; the measures for parts having a surface opposite to one of the two upper and lower surfaces each wafer has in wafer slicing (adjacent wafers or the cut ends) can be regarded as being the measures for the wafers of the seed side end 15, the wafers of the center portion 16, and the wafers of the tail side end 17.

In the measurements, both upper and lower surfaces of each wafer can be used for the measurements. For the cut ends, however, the surface facing the wafers of the seed side end 15 in slicing or the surface facing the wafers of the tail side end in slicing are used for the measurements.

Next, a measurement method for finding the measures of the carrier concentration; the average dislocation density; the absorption coefficient; and the Si concentration, the In concentration, and the B concentration will be described.

(Method of Measuring Carrier Concentration)

The carrier concentration is defined as a value obtained by sampling a part with a size of 10 mm×10 mm at the wafer center by cleaving from a wafer picked out; providing the four corners of the part with indium electrodes, followed by heating to 330° C. to 360° C.; then performing measurement by the Hall measurement using the Van der Pauw method.

(Method of Measuring Average Dislocation Density)

The average dislocation density is obtained by the measurement of the etch pit density (EPD), and is measured by pretreating a surface of a picked out wafer with a sulfuric acid-based mirror finish etching solution ($H_2SO_4$:$H_2O_2$:$H_2O$=3:1:1 (volume ratio)), then immersing the wafer in a KOH melt with a liquid temperature of 320° C. for 30 min to 40 min thereby forming etch pits, and counting the etch pits.

The measurement of etch pit density is performed by counting the formed etch pits by defining areas with a diameter of 3 mm at 69 points in the wafer and observing the areas under a microscope.

The areas at 69 points are distributed evenly over the wafer, and the areas are defined at positions distributed at regular intervals of 5 mm in the case of a 2 in wafer, 10 mm in the case of a 4 in wafer, 15 mm in the case of a 6 in wafer, and 20 mm in the case of a 8 in wafer.

A 10× objective lens for a field diameter of 1.73 mm is used for the observation of the areas. A field of view in which the most pits are observed in the areas is found and the etch pits are counted, and the number of etch pits counted is converted to the number per unit area (number/$cm^{-2}$). The average of the counts of the etch pits in the areas is used as the average dislocation density.

(Method of Measuring Absorption Coefficient)

When the absorption coefficient is measured, both front and rear surfaces of a GaAs wafer are subjected to mirror polishing to obtain damage-free surfaces. Here, if the wafer has been obtained by slicing using a wire saw, the mirror polishing is desirably performed to polish the surfaces by 70 μm or more. In this specification, samples were cut out to have a size of 20 mm×20 mm from around the center of a GaAs wafer having been subjected to mirror polishing as described above, followed by the measurement of the thickness after the polishing; and transmissivity measurements were performed on the samples using a spectrophotometer (UH5700 manufactured by Hitachi High-Tech Science Corporation). The measurement conditions were as follows.

Baseline setting: Air calibration
Start wavelength: 1300 nm
End wavelength: 850 nm
Sampling interval: 1 nm
Number of measurements: Once
Scan speed: 60 nm/min
Slit width: 2 nm The absorption coefficient α was found from the transmissivity measured using the spectrophotometer, using a double-side reflection model, according to the following formulae [1] and [2]. Note that the refractive index for each wavelength was calculated using the literature values given in "Refractive Index of GaAs Journal of Applied Physics 1964".

$$T = \frac{I}{I_0} = \frac{(1-R)^2 \times \exp(-\alpha d)}{1 - R^2 \times \exp(-2\alpha d)}, \quad [1]$$

$$R = \frac{(n-1)^2}{(n+1)^2}, \quad [2]$$

where $I_0$ is the intensity of light before incidence, I is the intensity of light having been transmitted through a wafer, T is the transmissivity, R is the reflectance, a is the absorption coefficient, d is the wafer thickness, and n is the refractive index of the wafer.

(Method of Measuring Si Concentration, in Concentration, and B Concentration)

The Si concentration, the In concentration, and the B concentration are values obtained by etching the surface of a picked out wafer with an etching solution ($NH_4OH$:$H_2O_2$:$H_2O$=1:1:10 (volume ratio)) to a depth of 5 μm, washing the wafer with pure water, and then drying the wafer, followed by the analysis of the wafer by secondary ion mass spectrometry (SIMS).

Specifically, a part with a depth of 0.5 μm to 1 μm from the surface is subjected to the measurements for Si and B by SIMS analysis using cesium ions at an ion energy set to 14.5 keV. A part with a depth of 3 μm from the surface is subjected to the measurement for In by SIMS analysis using oxygen ions at an ion energy set to 5.5 keV.

<Method of Producing GaAs Ingot>

A method of producing a GaAs ingot, according to this disclosure will now be described. In this production method, the vertical gradient freeze (VGF) method or the vertical Bridgman (VB) method is used, silicon is used as a dopant, and boron oxide is used as a sealant. Further, indium is used as a dopant together with silicon. The amount of silicon charged is 70 wt ppm or more and 130 wt ppm or less with respect to a GaAs feedstock, and the amount of indium charged is 100 wt ppm or more and 5000 wt ppm or less with respect to the GaAs feedstock. The average dislocation density of the GaAs ingot to be obtained is 1500/$cm^2$ or less. The average dislocation density of the GaAs ingot being 1500/$cm^2$ or less means that, for the respective wafers of the seed side end, the center portion, and the tail side end in the GaAs ingot described above, the wafers of any of the areas have an average dislocation density of 1500/$cm^2$ or less in the measurement results.

When a silicon doped n-type GaAs ingot is produced by the VGF method or the VB method, typically, a GaAs melt to which Si is added as a polycrystalline feedstock melt is used and $B_2O_3$ is used as a liquid sealant; in the production of a GaAs ingot of this disclosure, In is added in addition to Si. Further, the amount of silicon charged and the amount of indium charged are controlled so that the average dislocation density of the GaAs ingot to be obtained will be 1500/$cm^2$ or less. The following describes this production method in more detail with reference to FIG. 2 to FIG. 4.

(Production Apparatus and Temperature Control)

Figure 2:
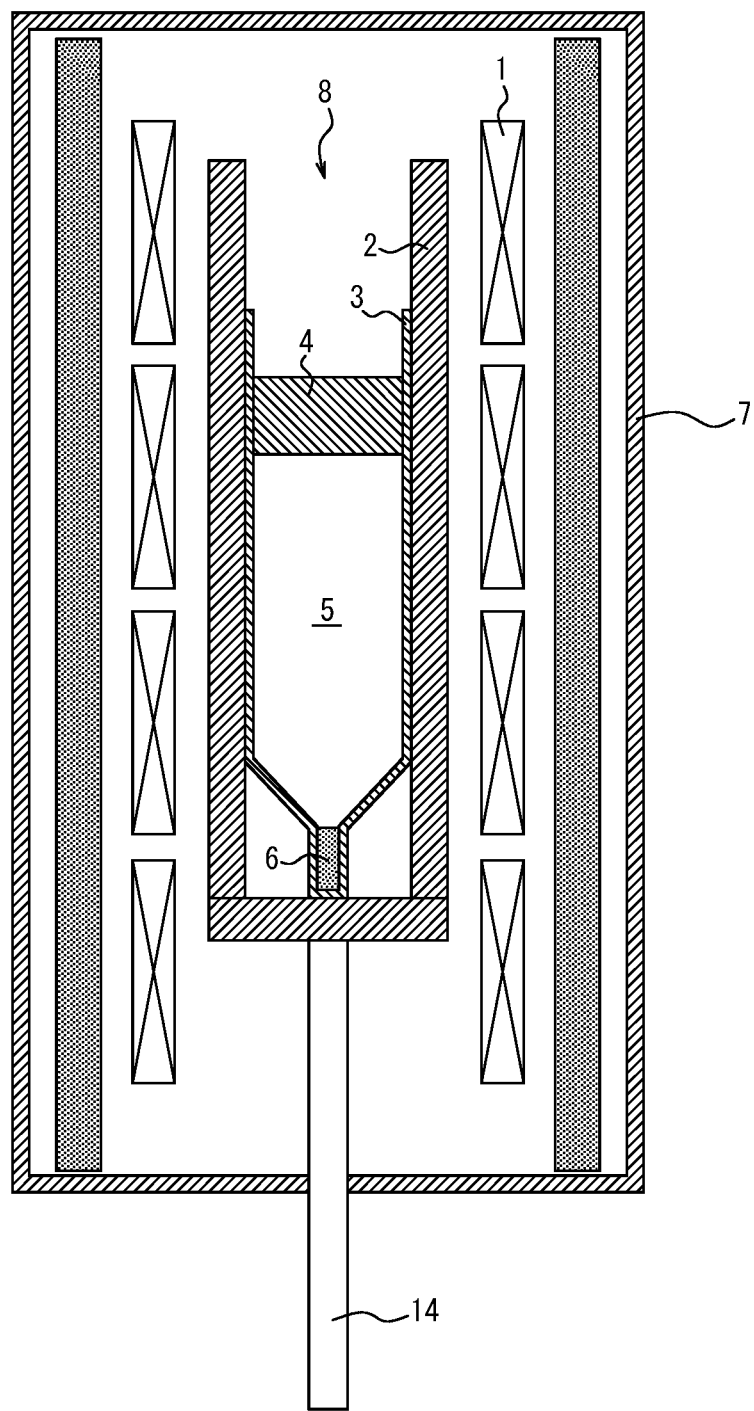
FIG. 2 is a schematic cross-sectional view of a production apparatus used for the production of a GaAs ingot of this disclosure.

FIG. 2 is a cross-sectional view schematically illustrating an example of a production apparatus for producing a GaAs ingot of this disclosure. The production apparatus depicted in FIG. 2 includes an airtight container 7 than can be evacuated and filled with the ambient gas from the outside; a crucible 3 placed at the center inside the airtight container 7; a crucible receiving container (susceptor) 2 in which the crucible 3 is held; a mechanism 14 for elevating and/or rotating the crucible receiving container (susceptor) 2 (only an elevating/rotating rod is depicted); and a heater 1 provided to surround the crucible receiving container (susceptor) 2 inside the airtight container 7. The crucible 3 may use one made of pyrolytic boron nitride (PBN). In FIG. 2, the crucible 3 is charged with the seed crystal 6, a compound semiconductor feedstock 5, and the sealant ($B_2O_3$) 4, and the airtight container 7 is for example filled with an inert gas 8.

Figure 3:
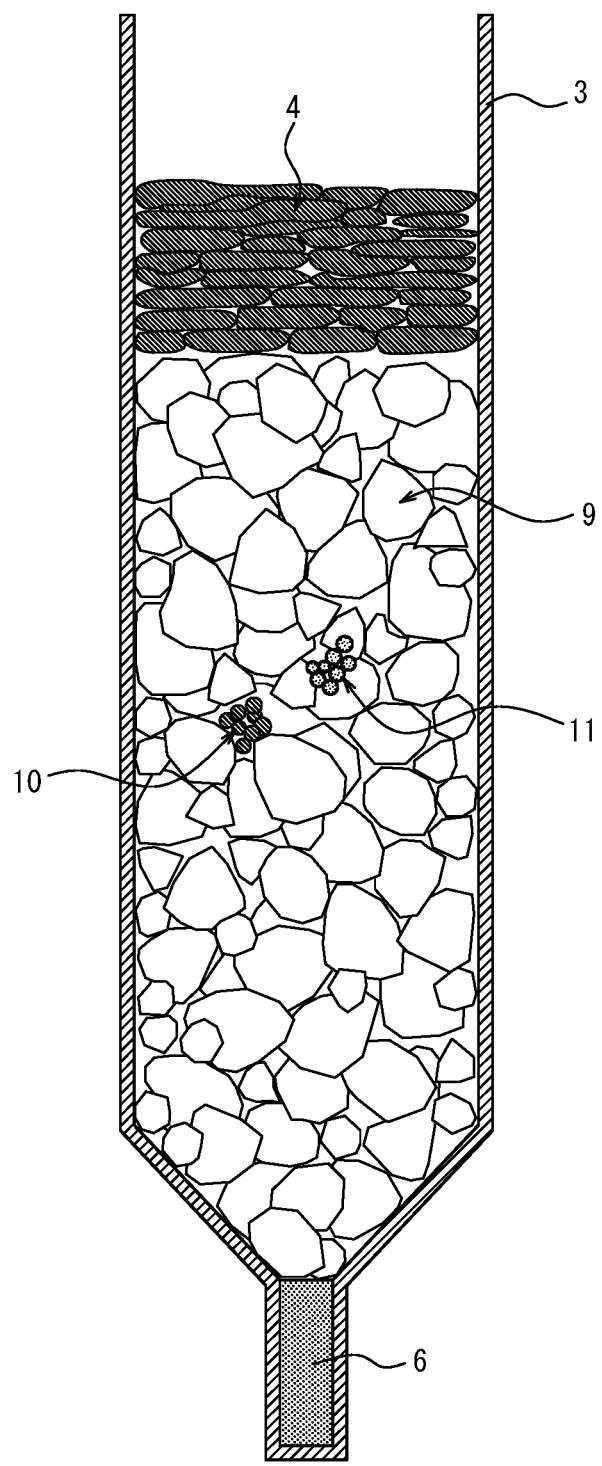
FIG. 3 is a schematic cross-sectional view of a crucible 3 used in the production of a GaAs ingot of this disclosure, corresponding to the state where the crucible is charged with feedstock and others before the start of crystal growth.

FIG. 3 is a cross-sectional view schematically illustrating an example of a crucible for producing a GaAs ingot of this disclosure, and corresponds to a state before crystal growth where the crucible is charged with the feedstock and others. The crucible 3 depicted in FIG. 3 is charged with the seed crystal 6, the polycrystalline GaAs feedstock 9, a dopant (silicon) 10 in the case of a typical silicon doped n-type GaAs ingot, and a sealant ($B_2O_3$) 4. The sealant ($B_2O_3$) 4 is used with a view to controlling the flying of As and the Si concentration at the start of crystal growth, and since the sealant has a lower density than GaAs, and a melting point (480° C.) significantly lower than the melting point of GaAs (1238° C.), it can cover the top of the feedstock melt in the growth of a single crystal. In this disclosure, for dopants, a dopant (indium) 11 is charged as a feedstock in addition to the dopant (silicon) 10.

Figure 4:
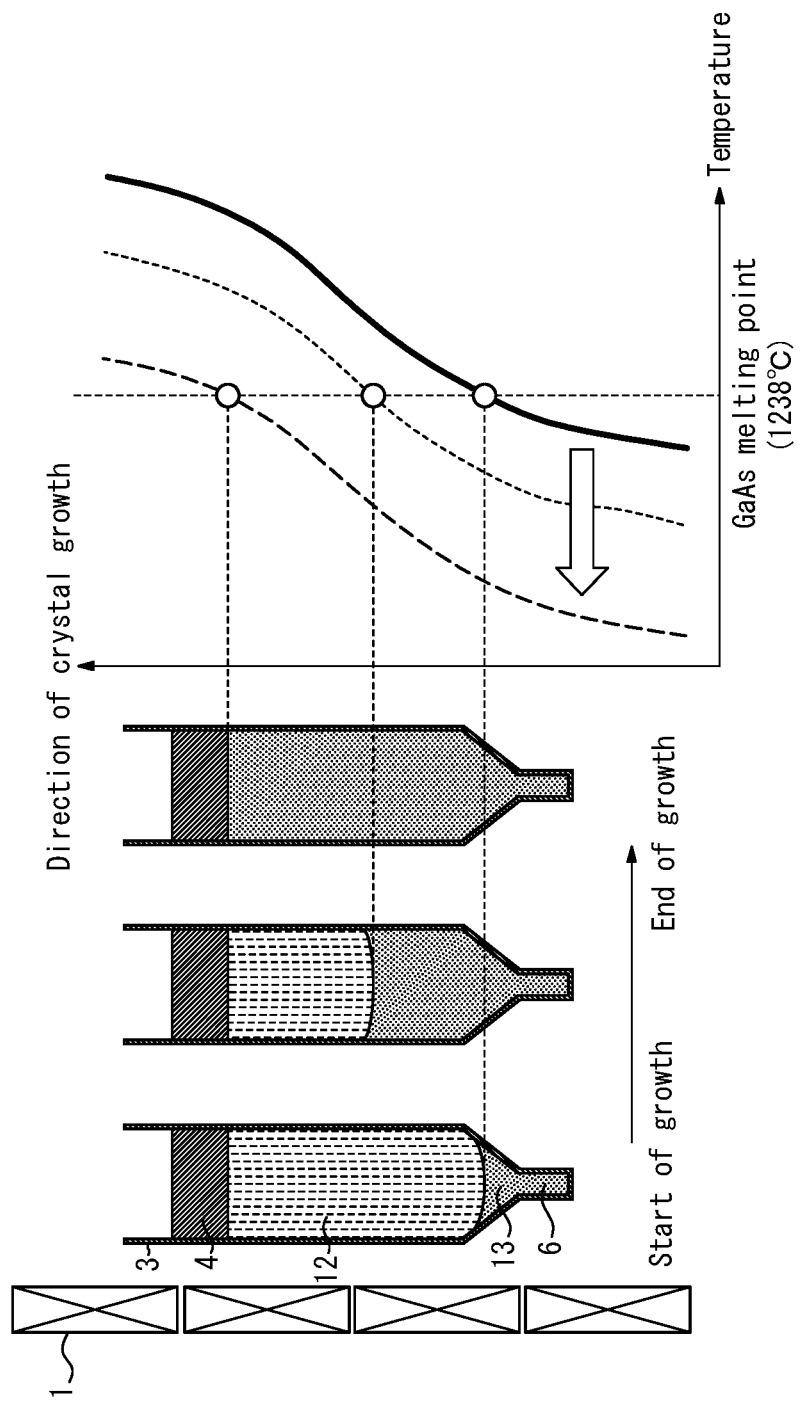
FIG. 4 is a diagram illustrating the relationship between the state inside a crucible and the temperature gradient from the start of crystal growth to the end of crystal growth.

After charging them, in the growth furnace filled with an inert gas, a temperature gradient is applied to the heater controlled to make the temperature on the seed crystal 6 side lower using a PID controller to prevent the seed crystal 6 from being melted, and meanwhile the polycrystalline GaAs feedstock 9 is heated to the melting point of GaAs: 1238° C. or higher to melt all the polycrystalline GaAs feedstock 9, the dopant (silicon) and the dopant (indium) 11, and the sealant ($B_2O_3$) 4. Next, the temperature around the seed crystal 6 is raised, and when an upper part of the seed crystal 6 melts, the temperature of the whole is gradually lowered while applying a temperature gradient, thus a GaAs ingot can be obtained. The cooling rate here is preferably 10° C./h or less. FIG. 4 illustrates an example of the relationship between the schematic state inside a crucible and the temperature gradient from the start of crystal growth to the end of crystal growth.

(Seed Crystal)

The size of the seed crystal 6 is not limited, and the seed crystal 6 preferably has for example a cross-sectional area of 1% to 20% of a cross-sectional area having an inner diameter that is the inner diameter of the crucible 3 and preferably has a cross-sectional area of 3% to 17% thereof. When the intended diameter of a crystal to be grown exceeds 100 mm, the cross-sectional area of the seed crystal 6 may be 2% to 10% of the cross-sectional area having a diameter that is the crucible inner diameter.

(Inner Diameter of Crucible and Wafer Size)

The inner diameter of the crucible 3 is preferably slightly larger than an intended wafer size. The intended wafer size may be appropriately selected for example from 2 in to 8 in; however, to obtain a GaAs wafer having a large diameter, the diameter of the wafer is preferably 100 mm or more, the diameter of the wafer is more preferably 140 mm or more, and the wafer size is still more preferably 6 in or more.

The larger the diameter is, the harder it gets to obtain a wafer having low dislocation density. When the diameter of the wafer is 140 mm or more, in a LEC method, even if doping is performed with indium of a large amount of more than $6.0 \times 10^{19}$ cm$^{-3}$, it is very difficult to obtain a wafer having an average dislocation density of 1500/cm$^2$ or less, and much more an average dislocation density of 500/cm$^2$ or less.

(Dopant)

The dopant (silicon) 10 is added into the polycrystalline GaAs feedstock 9 in a weight controlled to a desired concentration by, for example, a high purity Si shot or crushing a high purity Si substrate. Further, the dopant (indium) 11 is added into the polycrystalline GaAs feedstock 9 in a weight controlled to obtain a desired concentration using high purity In, or an indium compound (for example, high purity indium arsenide (InAs)). In adding Si, the amount of silicon charged is 70 wt ppm or more and 130 wt ppm or less with respect to the polycrystalline GaAs feedstock. The amount of silicon charged is preferably 80 wt ppm or more and also preferably 100 wt ppm or less with respect to the polycrystalline GaAs feedstock. In adding in, the amount of indium charged is 100 wt ppm or more and 5000 wt ppm or less with respect to the polycrystalline GaAs feedstock. The amount of indium charged is preferably 500 wt ppm, also preferably 1000 wt ppm or more, also preferably 4000 wt ppm or less, and also preferably 2000 wt ppm or less with respect to the GaAs feedstock. When high purity indium arsenide (InAs) is added to add In, the amount of indium charged may be calculated from the amount of InAs feedstock charged. The melting point of In is 156° C. and the melting point of InAs is 942° C.; they are much lower than the melting point of GaAs: 1238° C. Before the start of GaAs crystal growth, if In having melted first is deposited around the seed crystal 6, single crystallization is hindered; thus, it is necessary to contrive ways to prevent it from easily being deposited around the seed crystal 6 by adding the dopant (indium) 11 to a position away from the seed crystal 6 or appropriately placing the polycrystalline GaAs feedstock 9 as in FIG. 3. Also to prevent In from easily being deposited around the seed crystal 6, the size of the seed crystal 6 is preferably in the above range.

The above production method is one example, and conventional known methods may be added to adjust the concentrations of Si, In, and B incorporated into the GaAs ingot during the crystal growth; the average dislocation density; and the absorption coefficient. The carrier concentration is preferably $6.0 \times 10^{17}$ cm$^{-3}$ or more in at least one of the areas of the seed side end, the center portion, and the tail side end of the GaAs ingot. Further, the indium concentration is preferably $1.0 \times 10^{18}$ cm$^{-3}$ or more and $1.2 \times 10^{19}$ cm$^{-3}$ or less in at least one of the areas of the seed side end, the center portion, and the tail side end. Further, the average dislocation density is preferably 500/cm$^2$ or less in at least one of the areas of the seed side end, the center portion, and the tail side end; more preferably, the average dislocation density is 500/cm$^2$ or less in (wafers of) all the areas of the seed side end, the center portion, and the tail side end. Moreover, it is preferred to produce a GaAs ingot having a carrier concentration of $8.0 \times 10^{17}$ cm$^{-3}$ or more $1.40 \times 10^{18}$ cm$^{-3}$ or less and an absorption coefficient of 4.8 cm$^{-1}$ or more and 7.2 cm$^{-1}$ or less at a wavelength of 940 nm. It is also preferred to produce a GaAs ingot having a carrier concentration of $7.0 \times 10^{17}$ cm$^{-3}$ or more and $8.0 \times 10^{17}$ cm$^{-3}$ or less and an absorption coefficient of 4.8 cm$^{-1}$ or more and 6.8 cm$^{-1}$ or less at a wavelength of 940 nm. Conventional ingots doped with Si cannot be used in applications where the absorption coefficient is high, since the absorption coefficient is high in the area of high carrier concentration although the dislocation density can be reduced. However, in ingots according to this disclosure, increase in the absorption coefficient can be reduced while the dislocation density is reduced even in the area of high carrier concentration.

Increase in the absorption coefficient in the area having a carrier concentration of $6.0 \times 10^{17}$ cm$^{-3}$ or more in particular can be reduced.

For crystal growth, it is known that the impurity concentration has a tendency to increase or decreases in the direction of the crystal growth direction depending on the solubility coefficient of the impurity, and all the Si concentration, the In concentration, and the B concentration tend to increase from the seed side end 15 of the GaAs ingot toward the tail side end 17 thereof. Accordingly, the carrier concentration also has a tendency to increase from the seed side end 15 of the GaAs ingot toward the tail side end 17 thereof.

<GaAs Wafer>

A GaAs wafer according to this disclosure can be obtained by cutting out a wafer from the seed side end and the center portion of a GaAs ingot obtained by a method of producing a GaAs ingot, according to this disclosure. The GaAs wafer according to this disclosure has a silicon concentration of $5.0 \times 10^{17}$ cm$^{-3}$ or more and less than $3.5 \times 10^{18}$ cm$^{-3}$, an indium concentration of $3.0 \times 10^{17}$ cm$^{-3}$ or more and less than $3.0 \times 10^{19}$ cm$^{-3}$, and a boron concentration of $1.0 \times 10^{18}$ cm$^{-3}$ or more. The average dislocation density of the GaAs wafer is 1500/cm$^2$ or less. This GaAs wafer preferably has a carrier concentration of $6.0 \times 10^{17}$ cm$^{-3}$ or more. Further, the GaAs wafer preferably has an indium concentration of $1.0 \times 10^{18}$ cm$^{-3}$ or more and $1.2 \times 10^{19}$ cm$^{-3}$ or less and an average dislocation density of 500/cm$^2$ or less. The present inventors found through experiments that when the silicon concentration, the indium concentration, the boron concentration, and the average dislocation density of a GaAs wafer meet these conditions, both the carrier concentration and the absorption coefficient at a wavelength of 940 nm that are suitably used in producing LiDAR sensors in particular can be obtained.

The ranges of the silicon concentration, the indium concentration, the boron concentration, the average dislocation density, and others of a GaAs wafer, according to this disclosure will now be described.

(Si Concentration)

Considering that an excessive Si concentration causes absorption of free carriers to increase the absorption of infrared radiation and in terms of controlling the carrier concentration, a GaAs wafer according to this disclosure is designed to have a Si concentration of $5.0 \times 10^{17}$ cm$^{-3}$ or more and less than $3.5 \times 10^{18}$ cm$^{-3}$.

(Range of in Concentration)

The present inventors found that in the VGF method and the VB method, the degree of increase in the absorption of infrared radiation with increase in the carrier concentration can be controlled by adding In as a dopant in addition to Si. Accordingly, the In concentration was set to $1.0 \times 10^{18}$ cm$^{-3}$ or more and less than $3.0 \times 10^{19}$ cm$^{-3}$. Since In behaves as a neutral impurity in GaAs, it does not cause absorption of free carriers. However, since an excessively high In concentration causes deviations of the lattice constant and the band gap of the GaAs crystal also in the VGF method and the VB method, an In concentration of $3.0 \times 10^{19}$ cm$^{-3}$ or more would increase the absorption of infrared radiation. Accordingly, the In concentration is set to less than $3.0 \times 10^{19}$ cm$^{-3}$, preferably set to $2.0 \times 10^{19}$ cm$^{-3}$ or less, and more preferably set to $1.2 \times 10^{19}$ cm$^{-3}$ or less. It is also preferred that the ratio of the In concentration to the Si concentration (In/Si, also referred to as concentration ratio) is set to 1.0 or more.

(Range of B Concentration)

In the crystal growth of a GaAs ingot by the VGF method or the VB method, B$_2$O$_3$ is typically used as a liquid sealant to prevent As from dissociation during the crystal growth. Boron (B) from B$_2$O$_3$ is mixed into the GaAs ingot. In terms of controlling the Si concentration through the substitution reactions of Si with B at the start of crystal growth, the B concentration is preferably set to $1.0 \times 10^{18}$ cm$^{-3}$ or more. While the upper limit of the B concentration is not limited, the B concentration may be controlled to $3.0 \times 10^{19}$ cm$^{-3}$ or less, and is preferably $1.5 \times 10^{19}$ cm$^{-3}$ or less.

(Elements Other than the Above and their Concentrations)

No elements other than are Si and In preferably not added to GaAs except for B and oxygen (O) that are mixed into the GaAs ingot as B$_2$O$_3$ used as a sealant; it is preferred that only Si and In are added as dopants, and no other elements are deliberately added as dopants.

The elements that may be used as the dopants other than silicon and indium include beryllium (Be), magnesium (Mg), aluminum (Al), carbon (C), germanium (Ge), tin (Sn), nitrogen (N), sulfur (S), selenium (Se), tellurium (Te), and also include zinc (Zn), cadmium (Cd), chromium (Cr), and antimony (Sb); although these elements are allowed to be incorporated to an amount inevitably mixed in, yet are preferably not added deliberately.

For example, the concentrations of Al, C, and Zn in GaAs found by SIMS analysis are each preferably $3 \times 10^{16}$ cm$^{-3}$ or less (including zero). The concentrations of Be, Mg, Ge, Sn, N, S, Se, Te, Cd, Cr, and Sb other than the above elements are each preferably $5 \times 10^{15}$ cm$^{-3}$ or less (including zero). Further, the N concentration is more preferably $1 \times 10^{15}$ cm$^{-3}$ or less.

(Range of Average Dislocation Density)

The value of the average dislocation density is set to 1500/cm$^2$ or less. The average dislocation density is preferably 500/cm$^2$ or less, more preferably 300/cm$^2$ or less. Although the average dislocation density is preferably close to zero, the lower limit thereof may be set to 50/cm$^2$ considering the productivity.

(Ranges of Carrier Concentration and Absorption Coefficient)

In a GaAs wafer according to this disclosure, the carrier concentration is preferably at least $1.0 \times 10^{17}$ cm$^{-3}$ or more and is also preferably $6.0 \times 10^{17}$ cm$^{-3}$ or more as described above. Further, the absorption coefficient at a wavelength of 940 nm is preferably lower than in the case where only Si is added by doping (i.e., In is not contained). It is preferred that the carrier concentration is in a range of $8.0 \times 10^{17}$ cm$^{-3}$ or more and $1.4 \times 10^{18}$ cm$^{-3}$ or less, and the absorption coefficient at a wavelength of 940 nm is 4.8 cm$^{-1}$ or more and 7.2 cm$^{-1}$ or less. On the other hand, it is also preferred that in a GaAs wafer according to this disclosure, the a carrier concentration is $7.0 \times 10^{17}$ cm$^{-3}$ or more and $8.0 \times 10^{17}$ cm$^{-3}$ or less, and the absorption coefficient at a wavelength of 940 nm is 4.8 cm$^{-1}$ or more and 6.8 cm$^{-1}$ or less.

For conventional LiDAR applications, the carrier concentration has been required to be reduced to approximately $1 \times 10^{18}$ cm$^{-3}$ or less (preferably $5 \times 10^{17}$ cm$^{-3}$ or less); however, according to this disclosure, the absorption coefficient can be controlled to be low even when the carrier concentration is relatively high, allowing for device designing with reduced power consumption. In either case, the GaAs wafer can suitably be used as a LiDAR device substrate.

The above embodiments of this disclosure are by way of illustration, and this disclosure is not limited to those embodiments. The following provides a more detailed description of a GaAs wafer and a method of producing a GaAs ingot, according to this disclosure using examples. However, this disclosure is not in any way limited by the following examples.

EXAMPLES (Crystal No. 1)

GaAs ingots were produced using a production apparatus having a structure illustrated in FIG. 2.

<Charging Feedstock into Crucible>

PBN crucibles with an inner diameter of 159.9 mm and a seed part inner diameter of 6.0 mm to 6.5 mm were prepared as crucibles. As illustrated in FIG. 3, the crucibles were each charged with a 20,000±10 g polycrystalline GaAs feedstock obtained by crushing polycrystalline GaAs prepared by synthesizing 6N (purity: 99.9999% or more) Ga and 6N As, and a GaAs seed crystal cut out so that the (100) plane would be a crystal growth surface. The diameter of the GaAs seed crystal used was controlled by combining mechanical grinding and etching so that the diameter would be smaller than the seed part inner diameter of each crucible by approximately 0.5 mm. While charging the polycrystalline GaAs, a high purity Si shot was charged as a dopant (silicon) in 60 wt ppm with respect to the polycrystalline GaAs feedstock. No impurity element other than Si was deliberately added.

<Crystal Growth>

After charging these feedstocks, 965±10 g $B_2O_3$ was charged as a sealant. After the charging, the crucible was placed in a crucible receiving container (susceptor). The inside of the production apparatus depicted in FIG. 2 was repeatedly evacuated and purged with Ar gas to obtain an inert gas atmosphere, and a single crystal was then grown by the VGF method.

In the step of crystal growth, first, the feedstocks in the crucible were heated to the melting point of GaAs: 1238° C. or higher to obtain a melt while applying a temperature gradient using a heater controlled using a PID controller so that the temperature on the seed crystal side would be lower to prevent the GaAs seed crystal from melting. After that, after raising the temperature around the seed crystal to melt the top of the seed crystal, the temperature in the whole furnace was lowered at a rate of 10° C./h or less while applying a temperature gradient by heater control, thus an n-type GaAs ingot was grown using Si as a dopant.

<Evaluation>

A straight body part of each GaAs ingot grown was sliced into wafers using a wire saw. The wafer size was 6 in worth.

One obtained from the straight body part of the GaAs ingot at a position closest to the seed as a first wafer and any one of the five wafers counted from the first wafer as the seed side end (Seed) were evaluated. Further, a disc-shaped portion of the cut end having a part of the cone part having a surface facing the surface of the first wafer on the seed side (also referred to as a zeroth wafer) may also be subjected to the measurement.

When the straight body part of the GaAs ingot was sliced into wafers, a wafer of the middle position between the seed side end and the tail side end (when the position was on the cut surfaces, one of the two wafers having the surfaces) and two wafers on the seed side and two wafers on the tail side that bookend the wafer were evaluated as wafers of the center portion (Middle).

The last wafer counted from the above first wafer, obtained from the straight body part of the GaAs ingot at a position closest to the tail and any one of the five wafers counted from the last wafer toward the seed side end as the tail side end (Tail) were evaluated. The last cut surface was at a position of 20 mm from the end of the ingot opposite to the seed crystal (in the seed direction).

For the measurements below, at least three wafers in each area of the seed side end, the center portion, and the tail side end were used.

A part with a size of 10 mm×10 mm was sampled from an area including the center of the crystal of one of the sliced wafers (or the cut ends) (wafer center portion) using the cleaving property of the (110) plane, and the carrier concentration of the sample was measured by the Hall measurement using the Van der Pauw method.

After performing pretreatments as described above on the remainder of the wafers (or the cut ends) used in the Hall measurement, the Si concentration, the In concentration, and the B concentration of the remainder were measured by SIMS analysis using a system manufactured by CAMECA.

Each wafer surface next to (facing with the same cut surface therebetween) the wafers (or the cut ends) used in the above Hall measurement was subjected to the measurement of the EPD as described above, and the EPD was evaluated as the average dislocation density.

Wafers near the wafers used in the Hall effect measurement and the EPD measurement were used to measure the absorption coefficient at a wavelength of 920 nm. For the measurement of absorption coefficient, the absorption coefficient was determined by measuring the transmissivity using a spectrophotometer (UH5700 manufactured by Hitachi High-Tech Science Corporation) and using the formulae [1] and [2] given above.

(Crystal No. 2)

A GaAs ingot of Crystal No. 2 was obtained in the same manner as in the case of Crystal No. 1 except that while charging the GaAs polycrystalline feedstock, 100 wt ppm silicon was charged in a high purity silicon shot, and GaAs wafers cut out from the ingot were evaluated. No impurity element other than Si was deliberately added.

(Crystal No. 3)

A GaAs ingot of Crystal No. 3 was obtained in the same manner as in the case of Crystal No. 1 except that while charging the GaAs polycrystalline feedstock, 200 wt ppm InAs (equivalent to 121 wt ppm In) in a high purity InAs shot and 80 wt ppm silicon in a high purity silicon shot were charged and wafers cut out from the ingot were evaluated. No impurity element other than Si and In was deliberately added.

(Crystal No. 4)

A GaAs ingot was obtained in the same manner as in the case of Crystal No. 1 except that while charging the GaAs polycrystalline feedstock, 2000 wt ppm InAs (equivalent to 1210 wt ppm In) in a high purity InAs shot and 80 wt ppm silicon in a high purity silicon shot were charged and evaluations were performed.

(Crystal No. 5)

A GaAs ingot was obtained in the same manner as in the case of Crystal No. 1 except that while charging the GaAs polycrystalline feedstock, 5000 wt ppm InAs (equivalent to 3026 wt ppm In) in a high purity InAs shot and 80 wt ppm silicon in a high purity silicon shot were charged and evaluations were performed.

Figure 5:
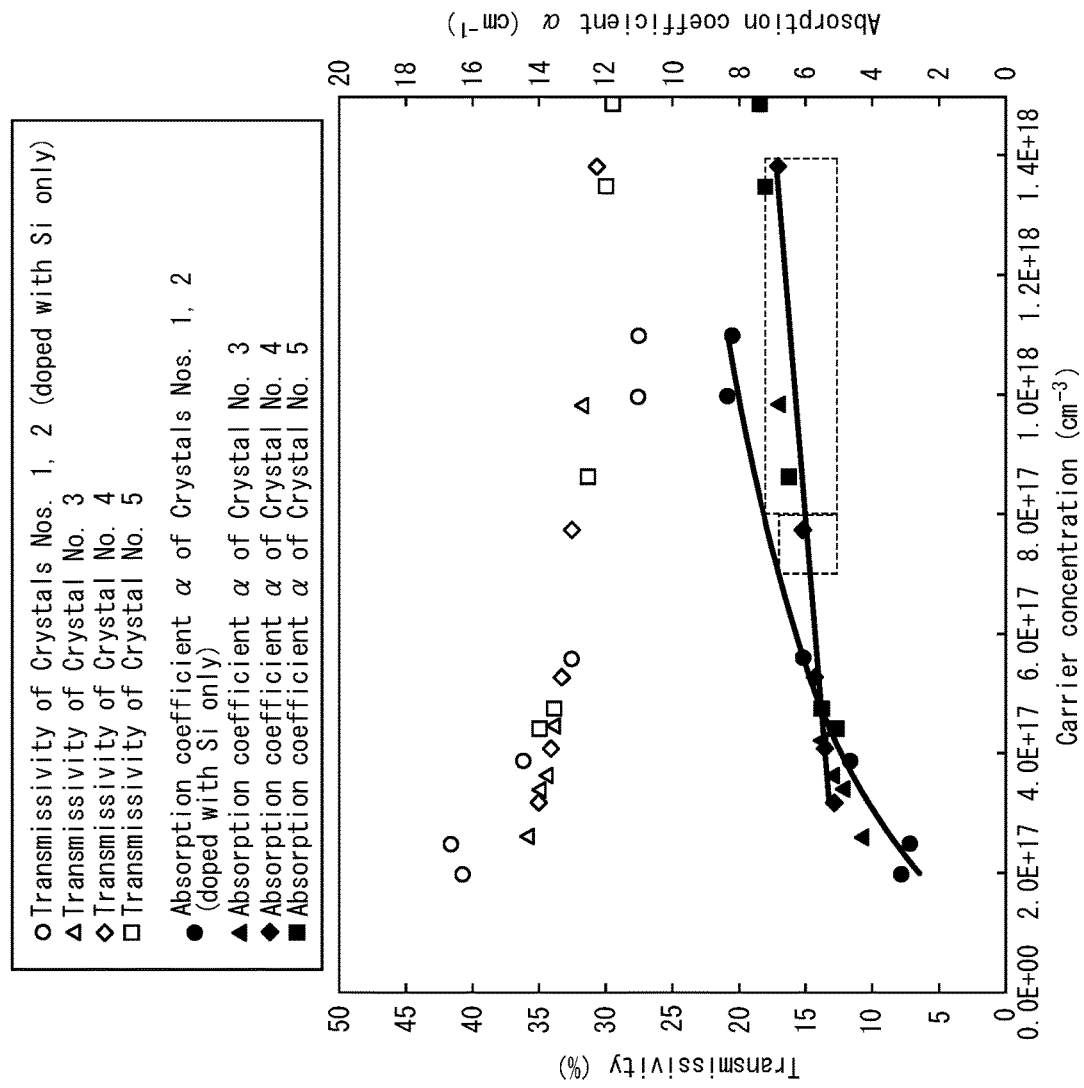
FIG. 5 is a graph illustrating the relationship between the carrier concentration of GaAs wafers obtained in Example and the transmissivity and the absorption coefficient of the wafers.

The production conditions for Crystals Nos. 1 to 5 and the evaluation results for the GaAs wafers cut out therefrom are given in Table 1. Further, the relationship between the carrier concentration of each wafer and the transmissivity and absorption coefficient thereof at a wavelength of 940 nm are given in FIG. 5. Note that the graph in FIG. 5 also includes the measurement results of wafers cut out from areas other than the areas given in Table 1. Further, a region in which the correspondence relationship between the carrier concentration and the absorption coefficient is particularly favorable is indicated by the broken line in FIG. 5.

TABLE 1

| | Production conditions | | | | | Evaluation results | | | | | |
|---|---|---|---|---|---|---|---|---|---|---|---|
| Crystal No. | Amount of Si charged wt ppm | Amount of InAs charged wt ppm | Amount of In charged wt ppm | Sample No. | Area | Si concentration $cm^{-3}$ | In concentration $cm^{-3}$ | B concentration $cm^{-3}$ | Average dislocation density number/$cm^2$ | Carrier concentration $cm^{-3}$ | Absorption coefficient $cm^{-1}$ |
| 1 | 60 | 0 | 0 | 1-1 | Seed | $3.79 \times 10^{17}$ | 0 | $3.75 \times 10^{18}$ | 1,770 | $1.96 \times 10^{17}$ | 3.1 |
| | | | | 1-2 | Tail | $5.31 \times 10^{17}$ | 0 | $4.23 \times 10^{18}$ | 2,403 | $2.50 \times 10^{17}$ | 2.84 |
| 2 | 100 | 0 | 0 | 2-1 | Seed | $8.13 \times 10^{17}$ | 0 | $5.12 \times 10^{18}$ | 617 | $3.90 \times 10^{17}$ | 4.62 |
| | | | | 2-2 | Middle | $1.14 \times 10^{18}$ | 0 | $6.16 \times 10^{18}$ | 349 | $5.60 \times 10^{17}$ | 6.02 |
| | | | | 2-3 | Tail | $2.54 \times 10^{18}$ | 0 | $1.06 \times 10^{19}$ | 145 | $1.00 \times 10^{18}$ | 8.29 |
| 3 | 80 | 200 | 121 | 3-1 | Seed | $5.04 \times 10^{17}$ | $3.91 \times 10^{17}$ | $4.15 \times 10^{18}$ | 474 | $2.42 \times 10^{17}$ | 4.5 |
| | | | | 3-2 | Between Seed and Middle | $7.77 \times 10^{17}$ | $4.48 \times 10^{17}$ | $5.01 \times 10^{18}$ | 706 | $3.73 \times 10^{17}$ | 5.11 |
| | | | | 3-3 | Middle | $7.79 \times 10^{17}$ | $5.34 \times 10^{17}$ | $5.02 \times 10^{18}$ | 714 | $3.74 \times 10^{17}$ | 5.15 |
| | | | | 3-4 | Between Middle and Tail | $9.10 \times 10^{17}$ | $6.66 \times 10^{17}$ | $5.43 \times 10^{18}$ | 470 | $4.37 \times 10^{17}$ | 5.4 |
| | | | | 3-5 | Tail | $2.10 \times 10^{18}$ | $1.10 \times 10^{18}$ | $9.22 \times 10^{18}$ | 343 | $1.01 \times 10^{18}$ | 6.69 |
| 4 | 80 | 2,000 | 1,210 | 4-1 | Seed | $6.73 \times 10^{17}$ | $3.87 \times 10^{18}$ | $4.68 \times 10^{18}$ | 430 | $3.19 \times 10^{17}$ | 5.12 |
| | | | | 4-2 | Between Seed and Middle | $8.65 \times 10^{17}$ | $4.42 \times 10^{18}$ | $5.29 \times 10^{18}$ | 286 | $4.10 \times 10^{17}$ | 5.41 |
| | | | | 4-3 | Middle | $1.11 \times 10^{18}$ | $5.04 \times 10^{18}$ | $6.06 \times 10^{18}$ | 136 | $5.27 \times 10^{17}$ | 5.73 |
| | | | | 4-4 | Between Middle and Tail | $1.59 \times 10^{18}$ | $6.30 \times 10^{18}$ | $7.59 \times 10^{18}$ | 156 | $7.73 \times 10^{17}$ | 6.07 |
| | | | | 4-5 | Tail | $3.13 \times 10^{18}$ | $1.13 \times 10^{19}$ | $1.25 \times 10^{19}$ | 196 | $1.38 \times 10^{18}$ | 6.8 |
| 5 | 80 | 5,000 | 3,026 | 5-1 | Seed | $8.94 \times 10^{17}$ | $9.67 \times 10^{18}$ | $5.38 \times 10^{18}$ | 210 | $4.43 \times 10^{17}$ | 5.07 |
| | | | | 5-2 | Middle | $1.83 \times 10^{18}$ | $1.26 \times 10^{19}$ | $8.33 \times 10^{18}$ | 677 | $8.65 \times 10^{17}$ | 6.47 |
| | | | | 5-3 | Tail | $3.21 \times 10^{18}$ | $2.74 \times 10^{19}$ | $1.27 \times 10^{18}$ | 1.133 | $1.49 \times 10^{18}$ | 7.36 |

The conductivity type of the GaAs ingots obtained was an n-type. GaAs wafers having a silicon concentration of $5.0 \times 10^{17}$ $cm^{-3}$ or more and less than $3.5 \times 10^{18}$ $cm^{-3}$, an indium concentration of $3.0 \times 10^{17}$ $cm^{-3}$ or more and less than $3.0 \times 10^{19}$ $cm^{-3}$, a boron concentration of $1.0 \times 10^{18}$ $cm^{-3}$ or more, and an average dislocation density of 1500/$cm^2$ or less were obtained from each of the GaAs ingots of Crystals Nos. 3 to 5 obtained by adding In in a charge amount of 100 wt ppm or more and 5000 wt ppm or less with respect to the GaAs feedstock. The GaAs wafers cut out from Crystal No. 4 in particular exhibited good results, and the average dislocation density was 500/$cm^2$ or less from the seed side end to the tail side end. When the cut out GaAs wafers had concentrations in the above ranges, the carrier concentration and the absorption coefficient at a wavelength of 940 nm were in favorable ranges. It was also found that while the absorption coefficient of the GaAs wafers cut out from Crystals Nos. 1 and 2 sharply increased with increase in the carrier concentration, the absorption coefficient of the GaAs wafers cut out from Crystals Nos. 4 and 5 gradually increased with increase in the carrier concentration. Thus, GaAs wafers that meet the carrier concentration and the absorption coefficient in appropriate ranges were obtained from Crystals Nos. 4 and 5.

INDUSTRIAL APPLICABILITY

This disclosure provides a GaAs wafer suitably used to produce LiDAR sensors in particular by limiting the silicon concentration, the indium concentration, and the boron concentration of a GaAs wafer. Further, this disclosure provides a method of producing a GaAs ingot that can be used to obtain such a GaAs wafer.

REFERENCE SIGNS LIST

1: Heater
2: Crucible receiving container (susceptor)
3: Crucible
4: Sealant ($B_2O_3$)
5: Compound semiconductor feedstock
6: Seed crystal
7: Airtight container
8: Inert gas
9: Polycrystalline GaAs feedstock
10: Dopant (silicon)
11: Dopant (indium)
12: Feedstock melt
13: Solid forming GaAs crystal
14: Crucible elevating/rotating mechanism
15: Seed side end of GaAs ingot
16: Center portion of GaAs ingot
17: Tail side end of GaAs ingot
18: Straight body part of GaAs ingot
19: Cone part of GaAs ingot

The invention claimed is:
1. An n-type GaAs wafer comprising:
silicon with a silicon concentration of $5.0 \times 10^{17}$ $cm^{-3}$ or more and less than $3.5 \times 10^{18}$ $cm^{-3}$;
indium with an indium concentration of $3.0 \times 10^{17}$ $cm^{-3}$ or more and less than $3.0 \times 10^{19}$ $cm^{-3}$;
boron with a boron concentration of $1.0 \times 10^{18}$ $cm^{-3}$ or more; and
zinc with a zinc concentration of $3 \times 10^{16}$ $cm^{-3}$ or less,
wherein an average dislocation density of the n-type GaAs wafer is 1500/$cm^2$ or less.

2. The n-type GaAs wafer according to claim 1, wherein a carrier concentration is $6.0 \times 10^{17}$ cm$^{-3}$ or more.

3. The n-type GaAs wafer according to claim 1, wherein the indium concentration is $1.0 \times 10^{18}$ cm$^{-3}$ or more and $1.2 \times 10^{19}$ cm$^{-3}$ or less, and the average dislocation density is 500/cm$^2$ or less.

4. The n-type GaAs wafer according to claim 1, wherein a carrier concentration is in a range of $8.0 \times 10^{17}$ cm$^{-3}$ or more and $1.4 \times 10^{18}$ cm$^{-3}$ or less, and an absorption coefficient at a wavelength of 940 nm is 4.8 cm$^{-1}$ or more and 7.2 cm$^{-1}$ or less.

5. The n-type GaAs wafer according to claim 1, wherein a carrier concentration is $7.0 \times 10^{17}$ cm$^{-3}$ or more and $8.0 \times 10^{17}$ cm$^{-3}$ or less, and an absorption coefficient at a wavelength of 940 nm is 4.8 cm$^{-1}$ or more and 6.8 cm$^{-1}$ or less.

6. A method of producing an n-type GaAs ingot, the method comprising performing a vertical gradient freeze method or a vertical Bridgman method using silicon as a dopant and using boron oxide as a sealant,
wherein indium is used together with the silicon as the dopant, and zinc is not used as the dopant,
an amount of silicon charged is 70 wt ppm or more and 130 wt ppm or less with respect to a GaAs feedstock, and an amount of indium charged is 100 wt ppm or more and 5000 wt ppm or less with respect to the GaAs feedstock, and
an average dislocation density of the n-type GaAs ingot is 1500/cm$^2$ or less.

7. The method of producing an n-type GaAs ingot, according to claim 6,
wherein the n-type GaAs ingot includes a part having a carrier concentration of $6.0 \times 10^{17}$ cm$^{-3}$ or more.

8. The method of producing an n-type GaAs ingot, according to claim 6,
wherein the average dislocation density is 500/cm$^2$ or less.

9. The method of producing an n-type GaAs ingot, according to claim 6,
wherein the n-type GaAs ingot includes a part having a carrier concentration of $8.0 \times 10^{17}$ cm$^{-3}$ or more and $1.4 \times 10^{18}$ cm$^{-3}$ or less, and an absorption coefficient of 4.8 cm$^{-1}$ or more and 7.2 cm$^{-1}$ or less at a wavelength of 940 nm.

10. The method of producing an n-type GaAs ingot, according to claim 6,
wherein the n-type GaAs ingot has a part having a carrier concentration of $7.0 \times 10^{17}$ cm$^{-3}$ or more and $8.0 \times 10^{17}$ cm$^{-3}$ or less, and an absorption coefficient of 4.8 cm$^{-1}$ or more and 6.8 cm$^{-1}$ or less at a wavelength of 940 nm.

* * * * *